United States Patent [19]
Bernstein et al.

[11] Patent Number: 5,783,942
[45] Date of Patent: Jul. 21, 1998

[54] UNWRAP CORRECTION FOR MR PHASE DATA ENCODING FLOW-RELATED PARAMETER

[76] Inventors: Matthew A. Bernstein, 413 Rawlins Dr., Waukesha, Wis. 53188; Gary H. Glover, 769 Mayfield Ave., Stanford, Calif. 94305

[21] Appl. No.: 782,027

[22] Filed: Dec. 30, 1996

[51] Int. Cl.$^6$ .................................................. G01R 33/20
[52] U.S. Cl. ........................... 324/306; 324/312; 600/419
[58] Field of Search ................................... 324/300, 306, 324/307, 309, 312; 600/419

[56] References Cited

U.S. PATENT DOCUMENTS

| | | | |
|---|---|---|---|
| 4,797,615 | 1/1989 | Rotem et al. | 324/309 |
| 4,947,120 | 8/1990 | Frank | 324/309 |
| 5,144,235 | 9/1992 | Glover et al. | 324/309 |
| 5,225,781 | 7/1993 | Glover et al. | 324/309 |
| 5,432,447 | 7/1995 | Song | 324/309 |
| 5,498,963 | 3/1996 | Schneider et al. | 324/309 |
| 5,510,711 | 4/1996 | Molyneaux et al. | 324/309 |
| 5,539,316 | 7/1996 | Sukumar | 324/320 |
| 5,594,336 | 1/1997 | Gullapalli et al. | 324/309 |

OTHER PUBLICATIONS

Bernstein et al. Proceedings of the International Society fo Magnetic Resonance in Medicine, vol. 2 (1996) "Unwrapping Quantitative Phase Contrast Images with a Polynomial Fit—Initial Experience" p. 1285.

*Primary Examiner*—Sandra L. O'Shea
*Assistant Examiner*—Michael Eisenberg
*Attorney, Agent, or Firm*—James O. Skarsten; John H. Pilarski

[57] ABSTRACT

A phase unwrapping method is provided comprising a post-processing MR operation for an array of phase-related MR data elements. The method includes the steps of defining a Region of Interest, of comparing each data element with the first and second data elements which are adjacent thereto in the array, in order to generate respectively corresponding first and second gradient values. A subset of the data elements is constructed, wherein a data element is assigned to the subset only if its corresponding first and second gradient values are less than a selected threshold value VENC/2. The data element subset is employed to generate a fitted phase function having a value at the position of each data element in the array, and the value of the fitted function thereof, for a given data element, is subtracted from the measured value thereof. A first unwrap correcting value is subtracted from the given data element if the difference is greater than a first specified level, and a second unwrap correcting value is added thereto if the difference is less than a second specified level. A measure of the number of wrapped pixels is monitored. The phase unwrap procedure can be iterated until the number of unwrapped pixels is zero, or does not decrease with further iterating.

19 Claims, 5 Drawing Sheets

UNWRAP CORRECTION FOR MR PHASE DATA ENCODING FLOW-RELATED PARAMETER

BACKGROUND OF THE INVENTION

The invention disclosed and claimed herein generally pertains to phase contrast magnetic resonance (MR) imaging for flow analysis and measurement. More particularly, the invention pertains to a method for detection of flow-related aliasing in a set of acquired phase contrast data, and applying phase unwrapping or unwrap correction thereto.

As is well known, phase contrast (PC) has become a very important tool in MR imaging for studying the flow of blood or other fluid material through an artery, a vein, or other vessel. In phase contrast imaging, velocity and flow direction can be encoded onto the phase of acquired MR data signals. As is further well known, phase of an MR signal, for a given voxel, is linearly proportional to the velocity of material flowing therethrough for the phase range $-180°$ to $+180°$. However, flow related aliasing is a serious issue for quantitative phase contrast studies. If the average flow velocity within a voxel either exceeds an aliasing velocity value VENC (velocity encoded value), or is less than a velocity $-$VENC, artifactually slow flow will be depicted in the corresponding image pixel, often with an apparent reversal of flow direction. Even if only a single pixel is aliased, or "wrapped" the entire phase contrast acquisition can be ruined, forcing the MR user to repeat a study. Conversely, if flow related aliasing is avoided by increasing VENC, then there is a severe signal to noise (S/N) penalty. Since S/N is inversely proportional to VENC, doubling VENC requires the imaging time to be increased by a factor of four to recover the S/N. Accordingly, correcting for flow-related aliasing is important to avoid repeating studies, poor S/N, or increased imaging time.

Phase unwrapping ("unwrap") is a technique which may provide a useful solution for flow aliasing. Phase unwrapping is an MR post-processing operation which extends the range of velocities over which the MR signal is linearly proportional to velocity. Without unwrap, the range is bounded by $-$VENC and $+$VENC since, in phase contrast imaging, blood flowing with a velocity of $\pm$VENC receives a phase difference of $\pm 180°$. In general, unwrap removes $360°$ jumps in phase, but in the context of phase contrast unwrap technique removes jumps of 2x VENC.

FIG. 1 illustrates the principle of unwrapping, and shows a plot of acquired MR signal strength versus flow velocity. The maximum anticipated velocity is VENC and the minimum velocity is $-$VENC, wherein sign indicates flow direction. The velocity threshold VENC corresponds to a phase of $180°$, and $-$VENC corresponds to a phase of $-180°$. Thus, velocity (and phase) have a linear relationship with signal strength between VENC and $-$VENC. Such relationship is shown in FIG. 1 as curve branch A.

Given such arrangement, if a velocity is encountered which is actually greater than VENC, and thereby corresponds to a phase angle greater than $180°$, it will be "wrapped around," or interpreted as corresponding to a negative phase on branch A. For example, a phase of $190°$ would be interpreted as $-170°$. As a result, the associated MR signal will be taken to be a negative value $-S_1$, rather than the correct positive value $S_2$. Signals derived from voxels having velocities in excess of VENC lie on curve branch B of FIG. 1, (unless the velocity exceeds $+2$VENC.) Similarly, signals derived from voxels having velocities less than $-$VENC lie on curve branch C thereof. If such signals are used in the construction of PC images, they will introduce flow-related aliasing, as referred to above. By means of phase unwrapping, the branches B and C can be moved in the respective directions shown by arrows in FIG. 1, into alignment with branch A. The linear region of the curve is thereby extended beyond $\pm$VENC, without increasing the level of VENC and thereby degrading S/N as described above. Accordingly, it would be very desirable to develop an efficient, reliable, and comparatively simple and straightforward unwrapping technique, for mathematically performing such alignment. References to phase unwrapping in the prior art, such as U.S. Pat. No. 5,144,235, issued Sep. 1, 1992 to Glover et al, have been directed to $B_0$ phase maps and the like, not to flow related aliasing.

SUMMARY OF THE INVENTION

The present invention provides an unwrap or phase unwrapping method comprising a post-processing MR operation for an array or set of phase-related MR data elements, wherein each data element has a specified position in the array. The method enables otherwise unusable flow analysis scanned data to be salvaged. Without unwrap, an MR user would have to reacquire quantitative phase contrast scans that displayed flow-related aliasing.

The method includes the step of subtracting each data element from first and second data elements adjacent thereto to generate respectively corresponding first and second gradient values. A gradient value is assigned to a gradient array if it has a specified relationship with a predetermined threshold value, assigned first and second gradient values comprising respective first and second gradient arrays. The first and second gradient arrays are employed to generate a fitted phase function having a value for each specified data element position. The method further includes the step of determining the difference between a given one of the data elements and the value of the fitted phase function at the position of the given data element. A first correcting value is subtracted from the given data element if the difference is greater than a first specified level, and a second correcting value is added to the given data element if the difference is less than a second specified level.

In a preferred embodiment, the method of the invention includes a preliminary step of determining how many of the data elements in the data element array are initially aliased or in a wrapped condition. The fitted function generating step comprises deriving first and second gradient functions from the data element subset, selecting a position on the boundary of a region of interest associated with the data element array, and combining the first and second gradient functions with the value of a data element at the selected position to generate the fitted phase function. The fitted phase function is then used to unwrap the aliased pixels. After the unwrap step the number of aliased pixels is again determined, and if necessary the entire procedure is repeated.

OBJECTS OF THE INVENTION

An object of the invention is to provide an efficient phase unwrapping technique for use in connection with PC imaging applied to flow analysis.

Another object is to provide a phase unwrapping technique of the above type which effectively salvages phase contrast data sets for use with flow analysis post-processing, wherein the phase contrast data would otherwise be unusable.

Another object is to unwrap phase images reconstructed with gradient linearity correction as set forth in "Gradient Non-linearity Correction for Phase Difference Images," by M. Bernstein and F. Frigo, an abstract included in the *Proceedings of the Society for Magnetic Resonance and European Society of Magnetic Resonance in Medicine and Biology*, Vol. 2, p. 739, August, 1996.

Another object is to provide a phase unwrapping technique which significantly extends the range over which flow velocity and signal strength have a linear relationship, wherein such extension does not degrade signal-to-noise ratio.

These and other objects of the invention will become more readily apparent from the ensuing specification, taken together with the accompanying drawings.

DETAILED DESCRIPTION OF THE PREFERRED EMBODIMENT

Figure 2:
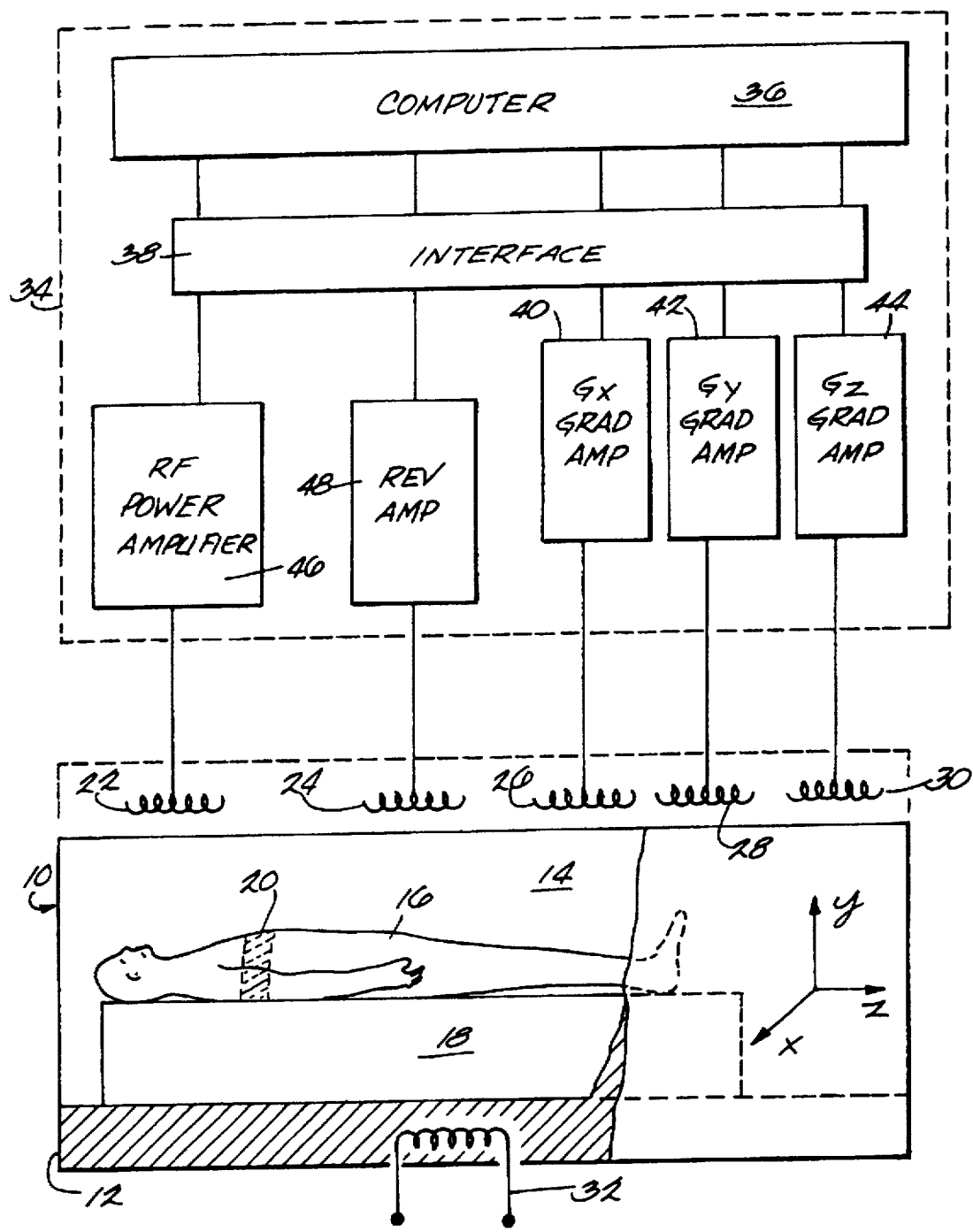
FIG. 2 is a block diagram showing an MR system in simplified form for use in implementing an embodiment of the invention.

Referring to FIG. 2, there are shown principal components of an MR imaging system 10, which may be used to acquire an array or set of MR data elements. System 10 includes a main magnet 12 provided with a bore 14. A patient or imaging subject 16 is positioned on a padded table or other patient support structure 18 in the bore 14, so that an MR image can be generated of a slice or section 20 taken through the patient 16. MR system 10 further includes an RF excitation coil 22, a receive coil 24, X-, Y-, and Z-gradient coils 26, 28, and 30, respectively, and a static main magnet coil 32. All of the coils 22 and 26–30 are incorporated into magnet 12, and are energized to project respective magnetic fields into bore 14, and to thereby generate MR data signals associated with the slice 20. Receive coil 24 is likewise incorporated into magnet 12, to detect or acquire the MR data signals.

MR system 10 additionally comprises a system electronics package 34, which includes a computer 36 interactively coupled to an interface 38, and gradient amplifiers 40, 42, and 44. The gradient amplifiers are each coupled to computer 36 through interface 38, to respectively energize gradient coils 26, 28, and 30. The electronics package 34 further includes an RF power amplifier 46, coupled to energize coil 22 to produce RF excitation pulses, and a receive amplifier 48 for amplifying MR data signals detected by receive coil 24. As is well known, a single coil can be substituted for RF excitation coil 22 and receive coil 24. In such modification, a switching mechanism (not shown) is provided to alternately couple excitation amplifier 46 and receive amplifier 48 to such single coil. It is to be understood that system electronics 34 is likely to include other components which are not shown for purposes of simplification. FIG. 2 also shows rectangular coordinate X-, Y, and Z-axes which are in mutually orthogonal relationship with one another, the Z-axis being directed along the axis of bore 14.

Computer 36 performs data processing functions with respect to MR data signals, such as Fourier transformation and image reconstruction. Computer 36 may also be employed to process acquired MR data in accordance with an embodiment of the invention, as described hereinafter in further detail.

Figure 1:
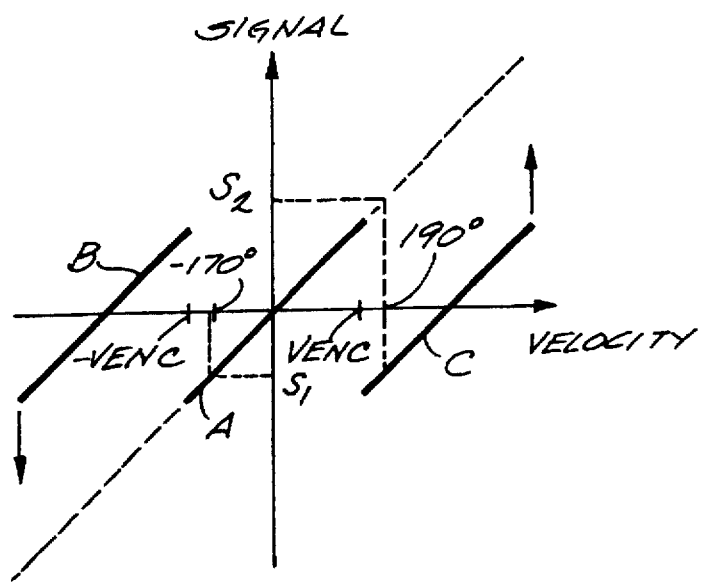
FIG. 1 is a plot of signal strength versus flow velocity which is proportional to phase for use in illustrating the principle of phase unwrapping.
Figures 3A, 3B:
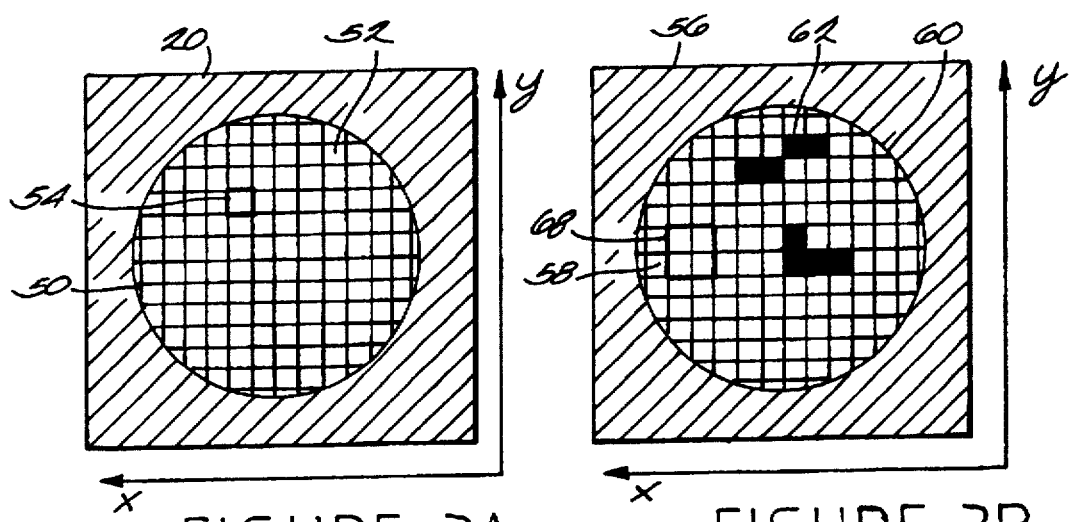
FIGS. 3A–3B depict an image acquired with the system of FIG. 2 and a corresponding phase contrast image, to illustrate flow-related aliasing.

Referring to FIG. 3A, there is shown the slice 20, lying in the X-Y plane for simplicity, taken from patient 16. Slice 20 includes a section of conduit for flowing material, such as a blood vessel 50 containing blood 52. For purpose of illustration, it is intended that blood 52 flows in a direction orthogonal to the X-Y plane, i.e., out of the plane of FIG. 3A and toward a viewer thereof.

As is well known, slice 20 comprises an array of volume elements or voxels 54, each having a corresponding MR signal component. The spatial position of each voxel with respect to the X- and Y- axes is indicated by the coordinates i and j. As is further well known, the material in the voxel (i, j) produces an MR signal component having both a magnitude and a phase $\phi(i, j)$. For a PC acquisition voxel containing flowing material such as blood 52, the phase represents or encodes flow velocity through the voxel.

From the phase information of respective voxels, and following conventional phase contrast acquisition and reconstruction techniques, a flow analysis image 56, shown in FIG. 3B, can be constructed with respect to the slice 20. Image 56 comprises pixels 58, likewise identified with respect to X- and Y- axes by i and j coordinates, respectively. More specifically, the phase of pixel (i,j) represents the velocity of material flowing through the voxel (i,j). The region of interest (ROI) of image 56 is the portion thereof depicting the blood 52 in vessel 50, i.e., the portion lying within boundary 60, which depicts the wall of vessel 50. A typical application of flow analysis is to extract volume flow information (milliliters/min) by multiplying flow velocity by pixel area, and summing the product over all pixels covering the lumen of a vessel.

In constructing image 56, it is intended to represent direction of flow by the sign of respective pixels 58. However, because of the phase wrapping problem referred to above, certain pixels 62 within boundary 60 are shown to be black rather than white. Such pixels could erroneously indicate a direction of flow away from a viewer of image 56, rather than toward the viewer. Thus, flow-related aliasing has occurred with respect thereto.

Prior to commencing the unwrap method of the invention, certain preliminary tasks are performed, in accordance with conventional flow analysis. After MR system 10 has been operated to acquire MR data for the slice 20, computer 36 processes the data to provide an array of phase values $\phi$ (i,j) for the corresponding pixels (i,j). The operator selects a boundary, 60, that contains the vessel. This boundary contains the region of interest or ROI. Prior to acquisition, the aliasing velocity parameter VENC was selected, thereby determining the velocity values at which phase wraparound, or flow aliasing, will occur. It is assumed here that respective phase values $\phi$ (i,j) are then scaled to the range between −VENC and VENC. Thereupon, the correction method of the invention can be implemented.

Figure 4A:
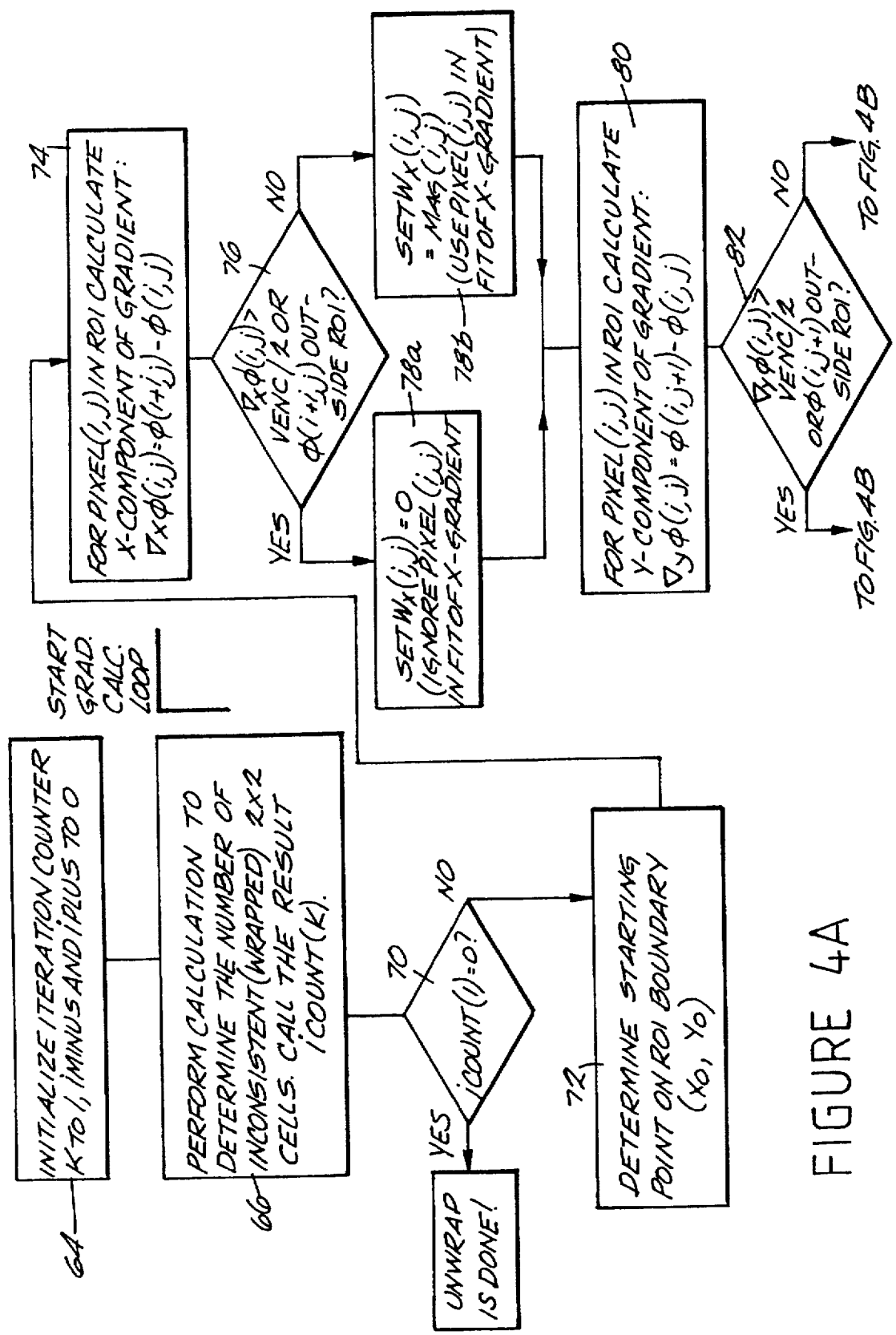
FIG. 4 is a flow chart showing respective steps of an embodiment of the invention.
Figure 4B:
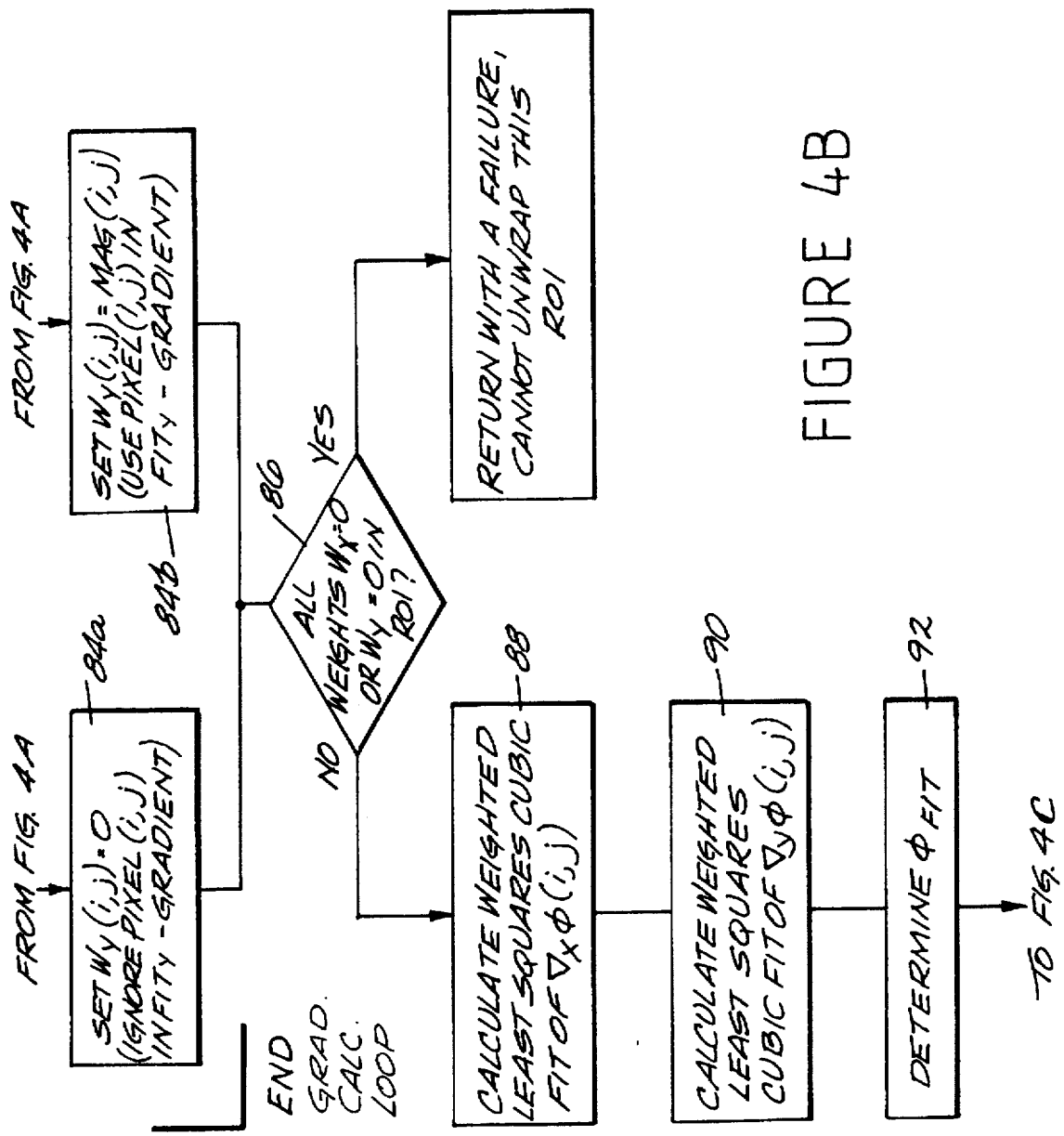
Figure 4C:
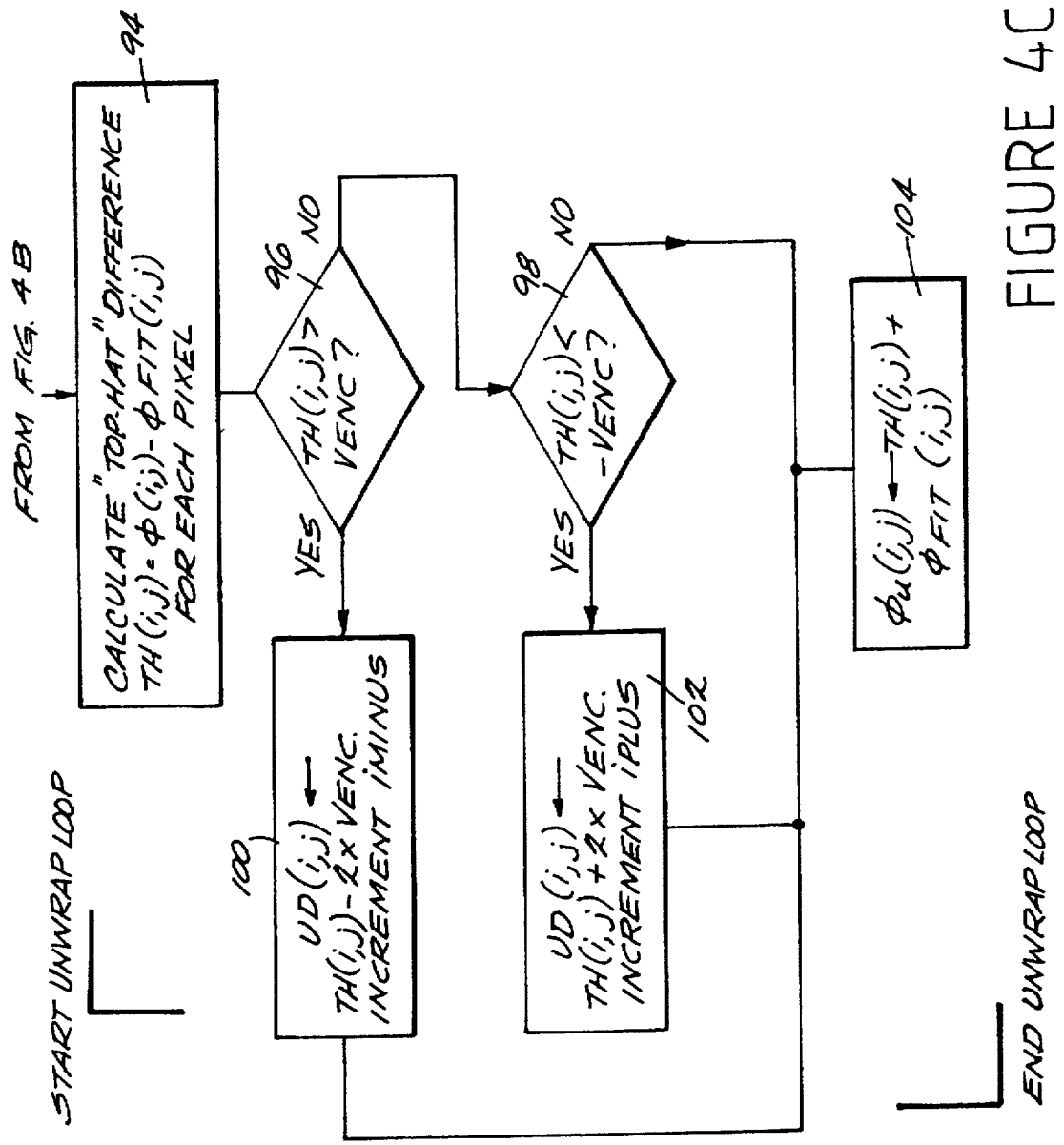

Referring to FIG. 4, there is shown the first step of the method indicated by a process block 64. In accordance therewith, an iteration counter is initialized to one, and iminus and iplus counts are set to zero. The counter is not shown but could comprise a component in computer 36 or could be implemented thereby.

Following counter initialization, the degree to which the ROI contains wrapped pixels is monitored, as indicated by process block 66 of FIG. 4. The process thereof decomposes the ROI into 2×2 pixel sub ROI'S or "cells," such as cell 68 shown in FIG. 3B. A cell associated with the pixel (i,j) is considered "bad" if the pixels (i,j), (i+1,j), (i,j+1), and (i+1, j+1) are all inside the ROI, and at least one of the following inequalities is true:

$|\phi(i,j+1)-\phi(i,j)| \geq \text{VENC}$, or  Equation (1)

$|\phi(i+1,j+1)-\phi(i,j+1)| \geq \text{VENC}$, or Equation (2)

$|\phi(i+1,j+1)-\phi(i+1,j)| \geq \text{VENC}$, or Equation (3)

$|\phi(i+1,j)-\phi(i,j)| \geq \text{VENC}$ Equation (4)

Due to the presence of noise, the threshold value VENC is somewhat arbitrary, but Equations 1–4 will be substantially true in the presence of wrapped pixels.

A bad cell suggests the presence of a phase jump or discontinuity of 2× VENC. Therefore, whenever the number of bad cells is zero, the unwrap procedure of the invention is done. This is illustrated by decision block 70, which indicates that the unwrap correction is completed if the statement icount (l) is zero, wherein icount (k) represents the number of wrapped cells determined by the process of block 66.

If the statement icount (l)=0 is false, a Gradient Calculation Loop, illustrated by blocks 72–84a–b in FIG. 4 must be executed. The general purpose of the Gradient Calculation Loop is to identify all pixels (i,j) which (1) are within the ROI, and (2) are substantially different in phase from adjacent pixels. It is reasonable to assume that pixels with substantial phase difference from neighboring pixels have encountered phase wrapping. By identifying such pixels, a subset of pixels can be provided which are in the ROI and have not been phase wrapped. Such subset is required to complete the unwrap correction process, as described hereinafter.

Prior to commencing the Gradient Calculation Loop, a starting point (x₀, y₀) on the ROI boundary 60 is selected, as indicated by process block 72. It is assumed that the pixels on the boundary are not wrapped. This is a good assumption since the flow velocity tends to be slower near the vessel walls. Starting from such point, each pixel (i,j) in the ROI is compared with the adjacent pixel (i+1,j) along the X-axis. This is achieved as shown by process block 74, by calculating a gradient $\nabla_x \phi(i,j)$, wherein $\nabla_x \phi(i,j) = \phi(i+1,j) - \phi(i,j)$. As shown by decision block 76 and process blocks 78a and 78b, each gradient $\nabla_x \phi$ (i,j) is compared with a threshold value VENC/2. If the $\nabla_x \phi(i,j)$ is greater than VENC/2, or if the phase $\phi(i+1,j)$ is outside the ROI, the pixel (i,j) gives a weight $W_x$ of zero. Otherwise, the pixel (i,j) is weighted with the magnitude of its corresponding MR signal component. Thus, VENC/2 is used as a threshold value, to determine whether there is a jump across phase pixels (i,j) and (i+1, j).

Similarly, as shown by process blocks 80, 84a, and 84b, and decision block 82, each pixel (i,j) is compared with the adjacent pixel (i,j+1) along the Y-axis. This is achieved by calculating the gradient $\nabla_y \phi(i,j)$, where $\nabla_y \phi(i,j) = \phi(i,j+1) - \phi(i,j)$. The pixel (i,j) is given a weight $W_y$ of zero if $\nabla_y \phi(i,j)$ is greater than VENC/2, and is otherwise given a weight equal to the magnitude of its corresponding MR signal component. Accordingly, at the conclusion of the Gradient Calculation Loop, there is obtained a two dimensional gradient array which only includes pixels which have not encountered phase wrapping.

Decision block 86 is provided for the possible condition that there will be no pixels in the subset, that is, that all weights $W_x$ and $W_y$ are zero. In such case, the ROI cannot be unwrapped by the proposed method.

If there are non-zero weights $W_x$, such weights are employed to fit the X-gradient component $\nabla_{x\phi FIT}$ to a polynomial. An example of a polynomial function is a cubic, that is:

$$\nabla_{x\phi FIT} = \alpha_0 + \alpha_1 x + \alpha_2 x^2 + \alpha_3 x^+ \quad \text{Equation (5)}$$

This procedure is represented by process block 88. The coefficients $a_n$ are computed from the weights $W_x(ij)$ with the following matrix operation, which is an example of the well-known method of least-squares/fitting:

$$\begin{vmatrix} a_0 \\ a_1 \\ a_2 \\ a_3 \end{vmatrix} = \begin{vmatrix} \Sigma\Sigma W_x(i,j) & \Sigma\Sigma W_x(i,j)x & \Sigma\Sigma W_x(i,j)x^2 & \Sigma\Sigma W_x(i,j)x^{3-1} \\ \Sigma\Sigma W_x(i,j)x & \Sigma\Sigma W_x(i,j)x^2 & \Sigma\Sigma W_x(i,j)x^3 & \Sigma\Sigma W_x(i,j)x^4 \\ \Sigma\Sigma W_x(i,j)x^2 & \Sigma\Sigma W_x(i,j)x^3 & \Sigma\Sigma W_x(i,j)x^4 & \Sigma\Sigma W_x(i,j)x^5 \\ \Sigma\Sigma W_x(i,j)x^3 & \Sigma\Sigma W_x(i,j)x^4 & \Sigma\Sigma W_x(i,j)x^5 & \Sigma\Sigma W_x(i,j)x^6 \end{vmatrix} \begin{vmatrix} \Sigma\Sigma W_x(i,j)\nabla_x\phi(i,j) \\ \Sigma\Sigma W_x(i,j)\nabla_x\phi(i,j)x \\ \Sigma\Sigma W_x(i,j)\nabla_x\phi(i,j)x^2 \\ \Sigma\Sigma W_x(i,j)\nabla_x\phi(i,j)x^3 \end{vmatrix}$$

Similarly, the non-zero weights $W_y$ (i,j) are employed to compute the Y-gradient component $\nabla_{y\phi FIT}$ of a fitted cubic phase function, where:

$$\nabla_{y\phi FIT} = b_0 + b_1 y + b_2 y^2 + b_3 y^3 \quad \text{Equation (7)}$$

Note that the fitting functions described in Equations 5 and 7 have zero curl, that is:

$$\frac{\partial}{\partial x}(b_0 + b_1 y + b_2 y^2 + b_3 y^3) - \frac{\partial}{\partial y}(a_0 + a_1 x + a_2 x^2 + a_3 x^3) = 0.$$

This insures that the two dimensional integration of a phase function, from (x₀, y₀) to (x,y), is path independent. The $\nabla_{y\phi FIT}$ computation procedure is represented by process block 90. The coefficients $b_n$ are computed from an equation analogous to Equation 6. The variables x and y which appear in Equations 5, 6 and 7 are linearly proportional to the pixel indices (i,j) respectively, with an appropriate scaling factor so that the calculations in Equation 6 neither underflow nor overflow.

Referring further to FIG. 4 there is shown a process block 92, following blocks 88 and 90, directed to determining a fitted phase function $\phi_{FIT}$ (x,y). This is accomplished by integrating Equations 5 and 7 as follows:

Equation (8)
$$\phi_{FIT}(x,y) = \phi(x_0, y_0) + \sum_{n=0} \frac{a_n(x^{n+1} - x_0^{n+1}) + b_n(y^{n+1} - y_0^{n+1})}{n+1}$$

It will be appreciated that the fitted phase function $\phi_{FIT}$ will have a value at each pixel (i,j), and that such value will be very close to the actual measured value of phase, if wrapping has not occurred. Accordingly, the process of block 92 is followed by the process of block 94. In accordance therewith, the fitted phase of each pixel (i,j) is subtracted from the measured phase thereof to provide a "top-hat" difference TH (i,j). The term "top-hat" difference is used to emphasize the substantial difference between fitted and measured phase values for a pixel, if phase wrapping has occurred, just as there is a substantial distance between the top and bottom ends of a "top-hat."

The final step of the unwrap correction method, as shown by decision blocks 96 and 98 and process blocks 100 and 102, is to compare the calculated difference TH (i,j) with the velocity range limits VENC and −VENC. If TH (i,j) is greater than VENC, the quantity 2×VENC is subtracted therefrom, to provide an unwrapped difference UD (i,j), and iminus is incremented. If TH (i,j) is less than −VENC, the quantity 2×VENC is added thereto to likewise provide an unwrapped difference UD (i,j), and iplus is incremented. The fitted phase $\phi_{FIT}$ (i,j) is then added to UD (i,j) to provide an unwrapped phase quantity $\phi_u$ (i,j), as shown by process block 104.

Finally, the number of "bad" cells is again calculated, this time with the unwrapped phase. If the number is zero, then the unwrap procedure is done. If the unwrap procedure decreased the number of bad cells, but not to zero, the procedure shown in the flow chart of FIG. 4 is iterated. That is, following the process of block 104 the process of block 66 is repeated, except that the result thereof is now icount (2). Thus, if icount (1)>icount (2) >0, the correction procedure shown in FIG. 4 is carried out again. More generally, following the kth iteration of the unwrap correction method, unwrap is done if icount (k+1)=0. If icount (k)>icount (k+1)>0, another iteration of the correction method is commenced, up to a maximum such as three iterations. If icount (k+1)≧icount (k), or k exceeds three, it may be necessary to generate a warning message.

Obviously, numerous other modifications and variations of the present invention are possible in light of the above teachings. It is therefore to be understood that within the scope of the disclosed concept, the invention may be practiced otherwise than as specifically described.

What is claimed is:

1. In an MR system employed to acquire an array of phase related data elements representing velocity, wherein each data element has a specified position in the array, an unwrap correction method comprising the steps of:

defining a region of interest, a portion of said data elements corresponding to said region of interest;

subtracting each corresponding data element from first and second data elements adjacent thereto to generate respective first and second gradient values;

assigning a gradient value to a gradient array if it has a specified relationship with a selected threshold value, assigned first and second gradient values comprising respective first and second gradient arrays;

generating a fitted phase function from said first and second gradient arrays, said fitted phase function having a value for each of said specified positions;

determining the difference between a given one of said corresponding data elements and the value of said fitted phase function at the specified position of said given data element; and selectively correcting said given data element if said difference is greater than a first specified level, or less than a second specified level.

2. The method of claim 1 wherein:

each of said corresponding data elements represents the velocity of flow of a material through said region of interest, a data element being wrapped if the value of its velocity lies outside a range having specified maximum and minimum values.

3. The method of claim 2 wherein:

said selected threshold of said assigning step comprises a value substantially equal to one half the value of said specified maximum value.

4. The method of claim 1 wherein:

said function generating step includes computation of first and second fitted phase gradient functions from said first and second gradient arrays, respectively.

5. The method of claim 4 wherein:

said function generating step further includes selectively integrating said first and second gradient functions to provide said fitted phase function.

6. The method of claim 5 wherein:

said fitted gradient functions have zero curl so that the two-dimensional integration of the gradient functions is path independent.

7. The method of claim 2 wherein:

said correcting step comprises subtracting a correcting value from said given data element if said difference is greater than said first specified level, and adding said correcting value to said given data element if said difference is greater than said second specified level.

8. The method of claim 7 wherein:

said specified maximum value comprises a predetermined velocity encoded value, said specified minimum comprises the negative of said velocity encoded value, and said correcting value comprises twice said velocity encoded value.

9. The method of claim 2 wherein:

said method includes a preliminary step of determining whether any of said elements are initially phase wrapped.

10. The method of claim 9 wherein:

said preliminary step comprises subtracting each of said phase elements from each of a plurality of adjacent phase elements and comparing each of the resulting differences with said specified maximum value of said range, a data element being phase wrapped if any one of the said resulting differences exceeds said maximum value.

11. The method of claim 2 wherein:

a first measurement of the number of said wrapped data elements is made prior to said subtracting step, a second measurement is made of the number of said wrapped pixels after said correcting step, and the results of said method are accepted only if the number of wrapped data elements is less for said second measurement than for said first measurement.

12. The method of claim 11 wherein:

the respective steps of said method, except said defining step, are iterated until the number of wrapped is zero, or the number of wrapped data elements following a given iteration is no less than the number thereof at the beginning of the said given iteration.

13. An unwrap correction method for phase related MR imaging data comprising an array of pixels representing velocity, said method comprising the steps of:

(a) defining a region of interest which includes selected pixels of said array;

(b) identifying respective selected pixels as being initially wrapped or unwrapped, the initially unwrapped pixels contributing to a gradient data set;

(c) fitting first and second gradient functions to the data of said gradient data set, with respect to first and second dimensions, respectively, associated with said pixel array;

(d) integrating said first and second gradient functions to produce a fitted phase function having a value corresponding to each of said selected pixels; and (e) comparing the difference between each selected pixel and its corresponding value to determine whether the pixel requires unwrap correction.

14. The method of claim 13 wherein:

the number of wrapped pixels is calculated before step (b) of said method and likewise calculated after step (e) of said method, the result of said method being accepted only if the number of wrapped pixels has decreased following said step (e).

15. The method of claim 14 wherein:

the steps (b)–(e) of said method are iterated until the number of wrapped pixels following a given iteration is zero, or is no less than the number of wrapped pixels at the beginning of said iteration.

16. The method of claim 13 wherein:

said first and second gradient functions have zero curl so that said integration to produce said fitted phase function is path independent.

17. The method of claim 13 wherein:

said fitted first and second gradient functions and said fitted phase function respectively comprise polynomial functions.

18. The method of claim 13 wherein:

said identifying step comprises measuring the difference between each of said selected pixels and first and second pixels adjacent thereto, the magnitude of the pixel being included in said gradient data set only if the measured differences associated therewith are less than a specified threshold value.

19. The method of claim 13 wherein:

said comparing step comprises measuring the difference between a given selected pixel and its corresponding value, and subtracting a correcting value to said given pixel if said difference is greater than a first specified level, and adding said correcting value to said given pixel if said difference is less than a second specified level.

\* \* \* \* \*